(12) United States Patent
Cheng et al.

(10) Patent No.: US 12,113,492 B2
(45) Date of Patent: Oct. 8, 2024

(54) POWER AMPLIFICATION APPARATUS, BEAMFORMING SYSTEM, TRANSMITTER, AND BASE STATION

(71) Applicant: HUAWEI TECHNOLOGIES CO., LTD., Shenzhen (CN)

(72) Inventors: Qianfu Cheng, Chengdu (CN); Guangjian Wang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 474 days.

(21) Appl. No.: 17/466,334

(22) Filed: Sep. 3, 2021

(65) Prior Publication Data
US 2021/0399697 A1   Dec. 23, 2021

Related U.S. Application Data

(63) Continuation of application No. PCT/CN2020/077658, filed on Mar. 3, 2020.

(30) Foreign Application Priority Data

Mar. 4, 2019 (CN) .......................... 201910161257.8

(51) Int. Cl.
   *H03F 3/24*    (2006.01)
   *H03F 1/02*    (2006.01)
   *H04B 1/04*    (2006.01)

(52) U.S. Cl.
   CPC .............. *H03F 3/24* (2013.01); *H03F 1/0227* (2013.01); *H04B 1/0475* (2013.01);
   (Continued)

(58) Field of Classification Search
   CPC .... H03F 3/24; H03F 1/0227; H03F 2200/102; H03F 2200/451; H03F 1/3241;
   (Continued)

(56) References Cited

U.S. PATENT DOCUMENTS 9,490,881 B2 * 11/2016 Wimpenny ............ H03F 1/0222
10,469,109 B2 * 11/2019 Gutman .................... H03F 3/24
(Continued)

FOREIGN PATENT DOCUMENTS

CN       1299186 A       6/2001
CN       1361938 A       7/2002
(Continued)

OTHER PUBLICATIONS

Avraham Sayag et al., "High-efficiency phased array using sequential over-the-air combining", Microwave Symposium (IMS), 2017 IEEE MTT-S International. IEEE, total:4pages.
(Continued)

*Primary Examiner* — Hieu P Nguyen
(74) *Attorney, Agent, or Firm* — Rimon PC

(57) ABSTRACT

This application provides a power amplification apparatus, a beamforming system, a transmitter, and a base station. The apparatus includes a power amplifier that amplifies a first signal, a power supply, and a power supply modulator that controls, based on an envelope signal corresponding to the first signal, an operating voltage provided by the power supply to the power amplifier. The apparatus is further configured to amplify a second signal. The first signal is generated based on the part of a target amplified signal whose amplitude falls within a preset amplitude range. The second signal is generated based on the part of the target amplified signal whose amplitude falls beyond the preset amplitude range.

16 Claims, 14 Drawing Sheets

(52) U.S. Cl.
CPC .. *H03F 2200/102* (2013.01); *H03F 2200/451* (2013.01); *H04B 2001/0425* (2013.01)

(58) Field of Classification Search
CPC .......... H03F 3/211; H03F 3/19; H03F 1/0211; H03F 3/245; H04B 1/0475; H04B 2001/0425; H04B 7/0426; H04B 7/0617; Y02D 30/70
USPC ...................................... 330/297, 124 R, 295
See application file for complete search history.

(56) References Cited

U.S. PATENT DOCUMENTS

| | | |
|---|---|---|
| 10,998,942 B2 | 5/2021 | Kim et al. |
| 2018/0102750 A1 | 4/2018 | Watkins et al. |
| 2018/0175809 A1 | 6/2018 | Zai et al. |

FOREIGN PATENT DOCUMENTS

| | | |
|---|---|---|
| CN | 101320963 A | 12/2008 |
| CN | 101926089 A | 12/2010 |
| CN | 103428140 A | 12/2013 |
| CN | 105474534 A | 4/2016 |
| CN | 105518991 A | 4/2016 |
| CN | 107005201 A | 8/2017 |
| CN | 108011724 A | 5/2018 |
| CN | 108768318 A | 11/2018 |
| CN | 109286375 A | 1/2019 |
| EP | 1102393 A2 | 5/2001 |
| WO | 2018023215 A1 | 2/2018 |

OTHER PUBLICATIONS

Avraham Sayag et al., "A 4 Element Phased Array Transmitter with Efficiency Enhancement Using Beamforming for High-Bandwidth WLAN Applications",2018 IEEE/MTT-S International Microwave Symposium—IMS 2018, Jun. 2018, total:4pages.

* cited by examiner

POWER AMPLIFICATION APPARATUS, BEAMFORMING SYSTEM, TRANSMITTER, AND BASE STATION

CROSS-REFERENCE TO RELATED APPLICATIONS

This application is a continuation of International Application No. PCT/CN2020/077658, filed on Mar. 3, 2020, which claims priority to Chinese Patent Application No. 201910161257.8, filed on Mar. 4, 2019. The disclosures of the aforementioned applications are hereby incorporated by reference in their entireties.

TECHNICAL FIELD

This application relates to the field of communication technologies, and in particular, to a power amplification apparatus, a beamforming system, a transmitter, and a base station.

BACKGROUND

With the rapid growth of the amount of communication data transmission, power amplifier (PA) efficiency faces challenges. Low efficiency increases energy consumption of a transmitter, and a series of problems arises from excessive heat generated by low efficient transmitters. For example, the size of a base station becomes larger, costs in heat dissipation increase, and reliability performance deteriorate. Therefore, high efficiency power amplifier technology has become a focus of current power amplifier design.

Class AB power amplifier is used in a conventional beamforming system. A maximum amplitude, which can be supported by the class AB power amplifier, of an amplified signal is determined based on an operating voltage that is input to the power amplifier. Therefore, to ensure high linearity of the system, the operating voltage of the power amplifier needs to be sufficient to support amplification of a part of the target amplified signal having the maximum amplitude of the target amplified signal. When the power amplifier amplifies a part, whose amplitude is relatively large, of the target amplified signal, that is, when the power amplifier operates in a power saturation region, efficiency of the power amplifier is relatively high. When the power amplifier amplifies a part whose amplitude is relatively small, that is, when the power amplifier operates in a power back-off region, efficiency of the power amplifier is relatively low.

When the target amplified signal is a signal with a relatively high peak to average power ratio (PAPR), the power amplifier needs to operate in a relatively high power back-off region most of the time. As a result, the average efficiency of the power amplifier is relatively low.

SUMMARY

This application provides a power amplification apparatus, a beamforming system, a transmitter, and a base station, to resolve a problem that average efficiency is relatively low because a conventional class AB power amplifier needs to operate in a power back-off region most of the time.

According to a first aspect, this application provides a power amplification apparatus. The apparatus includes a power amplifier, a power supply, and a power supply modulator, where the power supply is connected to the power amplifier through the power supply modulator.

The power amplifier is configured to amplify a first signal.

The power supply modulator is configured to control, based on an envelope signal corresponding to the first signal, an operating voltage provided by the power supply to the power amplifier.

The power amplification apparatus is further configured to amplify a second signal.

The first signal is generated based on a first part of a target amplified signal, where the first part's amplitude falls within a preset amplitude range. The second signal is generated based on a second part of the target amplified signal, where the second part's amplitude falls beyond the preset amplitude range, of the target amplified signal.

According to the technical solution provided in this application, because the power amplifier can operate in a power saturation region or a relatively low power back-off region most of the time, average operating efficiency of a related device to which the power amplifier is applied can be improved.

In a possible implementation, the power amplifier is a first power amplifier, the power supply is a first power supply, and the power supply modulator is a first power supply modulator.

The apparatus further includes a second power amplifier and a second power supply.

The second power amplifier is configured to amplify the second signal.

The second power supply is configured to provide an operating voltage to the second power amplifier.

In a possible implementation, the apparatus further includes a second power supply modulator.

The second power supply is connected to the second power amplifier through the second power supply modulator.

The second power supply modulator is configured to control, based on an envelope signal corresponding to the second signal, an operating voltage provided by the second power supply to the second power amplifier.

In a possible implementation, the target amplified signal may be a digital signal. The power amplification apparatus further includes a signal processor, where the signal processor is configured to receive the target amplified signal, and output a first digital signal and a second digital signal. The first digital signal is obtained based on the first part of the target amplified signal, where the amplitude of the first part falls within the preset amplitude range. The second digital signal is obtained based on the second part of the target amplified signal, where the amplitude of the second part falls beyond the preset amplitude range. The first analog signal and the second analog signal are obtained by performing digital-to-analog conversion on the first digital signal and the second digital signal, respectively.

The signal processor is further configured to generate a first digital envelope signal based on the first digital signal, and generate a second digital envelope signal based on the second digital signal. The envelope signal corresponding to the first signal is a first analog envelope signal obtained by performing digital-to-analog conversion on the first digital envelope signal, and the envelope signal corresponding to the second signal is a second analog envelope signal obtained by performing digital-to-analog conversion on the second digital envelope signal.

For example, the signal processor includes a signal splitting processing module, a first predistortion module, a second predistortion module, a first envelope shaping module, and a second envelope shaping module. An input end of the first predistortion module and an input end of the second predistortion module each are connected to one of a plurality of output ends of the signal splitting processing module. An output end of the first predistortion module is connected to an input end of the first envelope shaping module, and an output end of the second predistortion module is connected to an input end of the second envelope shaping module. Herein, the term "module" may refer to hardware, software, or hardware in combination with software, for example, a processing circuit programmed to perform certain functions.

The signal splitting processing module is configured to receive the target amplified signal, and output the first digital signal and the second digital signal.

The first predistortion module and the second predistortion module are respectively configured to perform predistortion processing on the received first digital signal and the received second digital signal, to improve signal linearity.

The first envelope shaping module is configured to generate a first digital envelope signal based on the first digital signal, and the second envelope shaping module is configured to generate a second digital envelope signal based on the second digital signal.

In a possible implementation, the apparatus further includes a signal converter.

The signal converter includes a first digital-to-analog converter, a second digital-to-analog converter, a first radio-frequency chain module, and a second radio-frequency chain module. The first digital-to-analog converter is connected to the first radio-frequency chain module, and the second digital-to-analog converter is connected to the second radio-frequency chain module.

The first digital-to-analog converter and the second digital-to-analog converter are configured to perform digital-to-analog conversion on the first digital signal and the second digital signal respectively, to obtain a first converted signal and a second converted signal. The first radio-frequency chain module and the second radio-frequency chain module are configured to modulate the first converted signal and the second converted signal respectively, to obtain the first analog signal and the second analog signal.

The signal converter further includes a first envelope conversion module and a second envelope conversion module.

The first envelope conversion module is configured to perform digital-to-analog conversion on the first digital envelope signal to obtain the first analog envelope signal. The second envelope conversion module is configured to perform digital-to-analog conversion on the second digital envelope signal to obtain the second analog envelope signal.

In a possible implementation, the amplitude range is a first amplitude range; and the second signal is generated based on a third part of the target amplified signal, where the amplitude of the third part falls within a second amplitude range.

A maximum value within the first amplitude range is less than or equal to a minimum value within the second amplitude range, or a maximum value within the second amplitude range is less than or equal to a minimum value within the first amplitude range.

The first amplitude range corresponds to a rated output power of the first power supply, and the second amplitude range corresponds to a rated output power of the second power supply.

In a possible implementation, the maximum value within the first amplitude range is less than or equal to the minimum value within the second amplitude range.

The second power amplifier and the second power supply modulator are further configured to enter an operating state when receiving a control signal, where the control signal is generated when an amplitude of the target amplified signal falls within the second amplitude range.

In a possible implementation, the maximum value within the first amplitude range is less than or equal to the minimum value within the second amplitude range.

In some implementations, the apparatus includes more than one first power amplifier. The quantity of first power amplifiers is X, and X is greater than or equal to 1.

Each of the X first power amplifiers is configured to receive the first signal and amplify the first signal.

The first power supply is connected to each of the first power amplifiers through the first power supply modulator.

In a possible implementation, a quantity of first power supplies is X, and a quantity of first power supply modulators is X.

The X first power supplies are one-to-one connected to the X first power supply modulators, and the X first power supply modulators are one-to-one connected to the X first power amplifiers.

The $i^{th}$ first power supply modulator in the X first power supply modulators is configured to receive the envelope signal corresponding to the first signal, and control, based on the envelope signal corresponding to the first signal, an operating voltage provided by the $i^{th}$ first power supply in the X first power supplies to the $i^{th}$ first power amplifier.

In a possible implementation, the apparatus further includes X first phase shifters and a second phase shifter.

Each of the first phase shifters is configured to receive the first signal. The X first phase shifters are one-to-one connected to the X first power amplifiers, and any one of the first power amplifiers is configured to amplify the first signal received from a correspondingly connected first phase shifter.

The second phase shifter is configured to receive the second signal. The second phase shifter is connected to the second power amplifier. The second power amplifier is configured to amplify the second signal received from the second phase shifter.

In a possible implementation, the apparatus further includes an antenna, the antenna includes at least two antenna units, and the first power amplifier and the second power amplifier are separately connected to at least one antenna unit in the antenna. For example, the antenna may include X first antenna units and a second antenna unit. The X first antennas are one-to-one connected to output ends of the X first power amplifiers, and an output end of the second power amplifier is connected to the second antenna.

According to a second aspect, this application provides a beamforming system. The system includes a digital precoder and at least two power amplification apparatuses, and at least one of the at least two power amplification apparatuses is the power amplification apparatus according to any one of the possible implementations of the first aspect or the first aspect.

The digital precoder is connected to input ends of the at least two power amplification apparatuses.

The digital precoder is configured to receive at least one signal stream, and precode the at least one signal stream to obtain at least two target amplified signals. The digital precoder is further configured to send the at least two target amplified signals to the at least two power amplification apparatuses, where the at least two target amplified signals one-to-one correspond to the at least two power amplification apparatuses.

According to a third aspect, this application provides a transmitter, including the power amplification apparatus according to any one of the possible implementations of the first aspect or the first aspect, or the beamforming system according to the second aspect.

According to a fourth aspect, this application provides a base station, including the power amplification apparatus according to any one of the possible implementations of the first aspect or the first aspect, or the beamforming system according to the second aspect. For example, the base station may include a transmitter and a receiver, and the transmitter may include the power amplifier according to any one of the possible implementations of the first aspect or the first aspect, or the beamforming system according to the second aspect.

BRIEF DESCRIPTION OF DRAWINGS

To describe the technical solutions in this application or in the prior art more clearly, the following briefly describes the accompanying drawings for describing the embodiments. It is clearly that the accompanying drawings in the following description show some embodiments of this application, and a person of ordinary skill in the art may still derive other drawings from these accompanying drawings without creative efforts.

DESCRIPTION OF EMBODIMENTS

To make objectives, technical solutions, and advantages of this application clearer, the following clearly describes the technical solutions in this application with reference to the accompanying drawings in this application. It is clearly that the described embodiments are merely a part rather than all of the embodiments of this application. All other embodiments obtained by a person of ordinary skill in the art based on the embodiments of this application without creative efforts shall fall within the protection scope of this application.

The technical solutions provided in this application relate to a power amplification apparatus on which a power amplifier is used, and may be applied to a communication device such as a beamforming system, a transmitter, or a base station.

Figure 1:
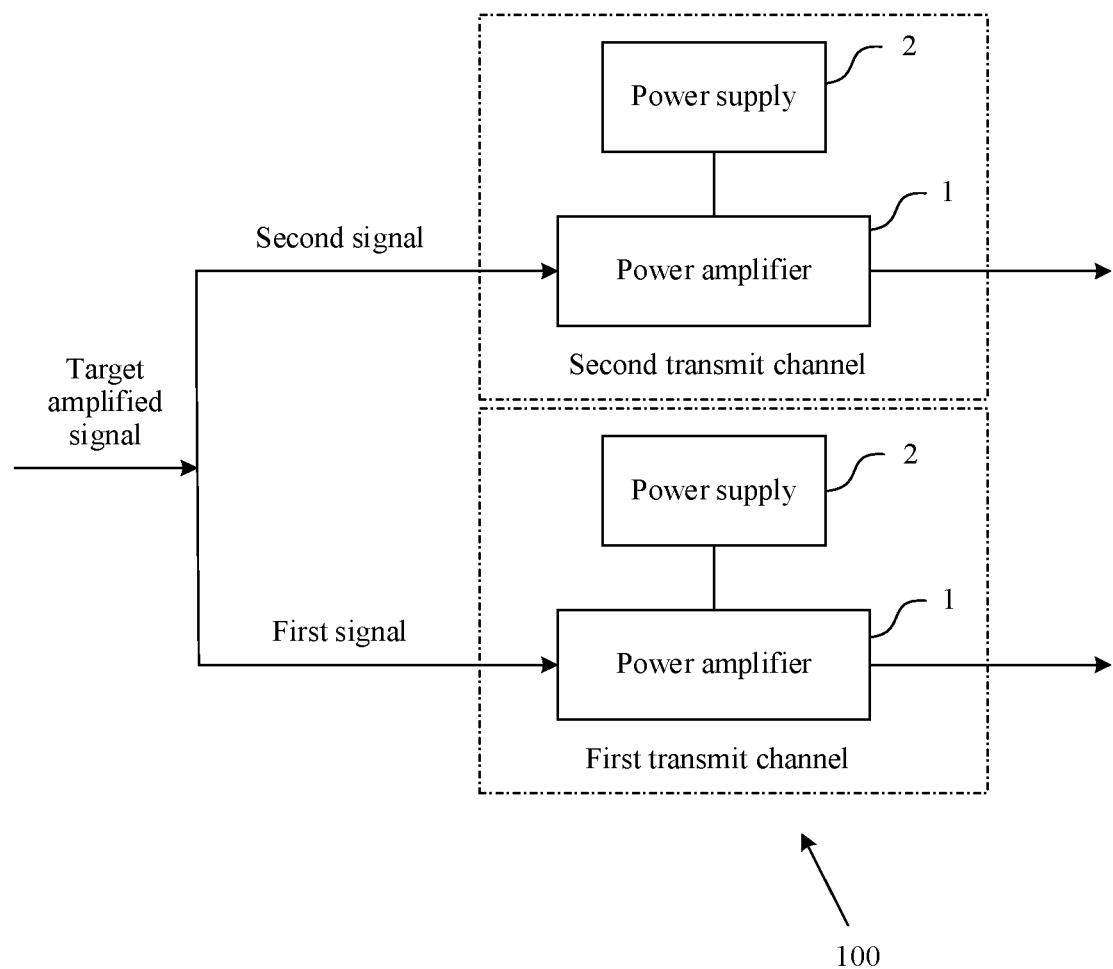
FIG. 1 is a first schematic structural diagram of a power amplification apparatus according to an embodiment of this application.

FIG. 1 is a first schematic structural diagram of a power amplification apparatus according to an embodiment of this application. The power amplification apparatus 100 in this embodiment of this application may be configured to amplify a target amplified signal.

As shown in FIG. 1, the apparatus 100 may include a first transmit channel and a second transmit channel. The first transmit channel and the second transmit channel each include a power amplifier 1 and a power supply 2 that provides an operating voltage for the power amplifier. An operating voltage provided by the power supply on the first transmit channel may be used to support the power amplifier on the first transmit channel to amplify a signal whose amplitude falls within a first amplitude range, and an operating voltage provided by the power supply on the second transmit channel is used to support the power amplifier on the second transmit channel to amplify a signal whose amplitude falls within a second amplitude range.

In a process in which the apparatus 100 amplifies the target amplified signal, the apparatus 100 may split the target amplified signal into a first signal and a second signal based on the first amplitude range and the second amplitude range, and amplify the first signal and the second signal through the first transmit channel and the second transmit channel, respectively. It should be noted that an amplitude range between a maximum amplitude and a minimum amplitude of the target amplified signal may be divided into the first amplitude range and the second amplitude range based on a preset amplitude threshold. For example, the preset amplitude threshold may be an average amplitude of the target amplified signal in a preset period of time.

Compared with conventional class A and class AB power amplifiers, the power amplification apparatus may enable the power amplifier on the first transmit channel or the second transmit channel to operate in a power saturation region or a relatively low power back-off region most of the time, thereby improving average efficiency of the power amplifier.

To further improve average efficiency of a power amplifier, this application provides a power amplification apparatus.

Figure 2:
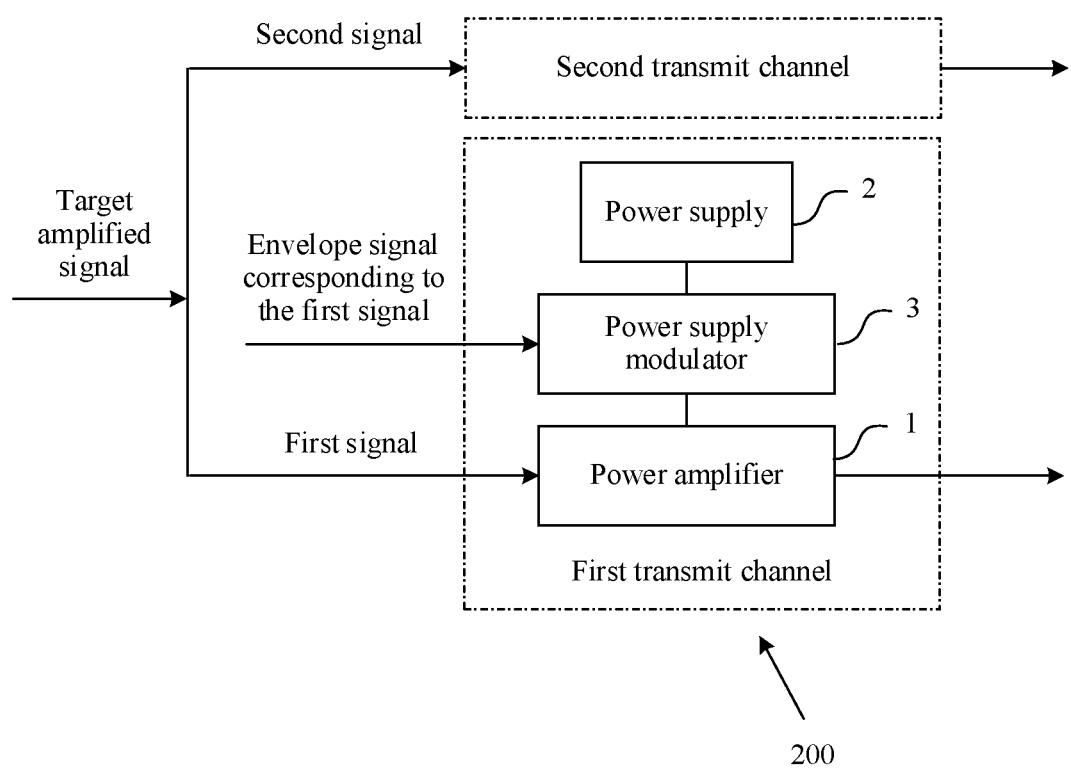
FIG. 2 is a second schematic structural diagram of a power amplification apparatus according to an embodiment of this application.

FIG. 2 is a second schematic structural diagram of a power amplification apparatus according to this application. The power amplification apparatus 200 in this embodiment of this application may also be configured to amplify a first signal and a second signal that are obtained by splitting a target amplified signal based on a preset amplitude range.

As shown in FIG. 2, the apparatus 200 may include a power amplifier 1 configured to amplify the first signal, a power supply 2, and a power supply modulator 3. The power supply 2 may be connected to the power amplifier 1 through the power supply modulator 3. The power supply modulator 3 is configured to control, based on an envelope signal corresponding to the first signal, an operating voltage provided by the power supply 2 to the power amplifier 1.

In this embodiment of this application, the first signal may be generated based on a first part of the target amplified signal, where the first part's amplitude falls within the preset amplitude range; and the second signal is generated based on a second part of the target amplified signal, where the second part's amplitude falls beyond the preset amplitude range. For example, the preset amplitude range may be a first amplitude range. The first signal may be generated based on the first part; and the second signal may be generated based on the second part. The power supply modulator in this embodiment of this application may be an envelope tracking power supply modulator. For example, the power supply modulator may be an ET pulse skip modulator (ET PSM). The envelope signal corresponding to the first signal may be input to a drain or a collector of the power supply modulator.

In this embodiment of this application, the first amplitude range and the second amplitude range are obtained through division based on an amplitude range of a baseband target amplified signal. The target amplified signal may be split into a first digital signal and a second digital signal based on the first amplitude range and the second amplitude range. The first digital signal and the second digital signal may be referred to as a first baseband signal and a second baseband signal. The first signal may be a first analog signal obtained by performing digital-to-analog conversion on the first digital signal, and the second signal may be a second analog signal obtained by performing digital-to-analog conversion on the second digital signal. The envelope signal corresponding to the first signal may be a first analog envelope signal obtained by performing digital-to-analog conversion on a first digital envelope signal corresponding to the first digital signal. Alternatively, the envelope signal corresponding to the first signal may be an envelope signal corresponding to the first analog signal. The envelope signal corresponding to the first signal may be used to reflect a time-varying amplitude of the first digital signal.

It should be noted that, the envelope signal corresponding to the first signal may be used to reflect a time-varying amplitude of a first part of the target amplified signal, where the first part's amplitude falls within the first amplitude range; and the first signal is generated based on the first part. Therefore, when the power supply modulator 3 controls, based on the envelope signal corresponding to the first signal, the operating voltage provided by the power supply 2 to the power amplifier 1 that is configured to amplify the first signal, a real-time operating voltage of the power amplifier 1 changes with the amplitude, falling within the first amplitude range, of the first part. In other words, the power supply modulator tracks signal envelope in real time and provides an aligned envelope voltage to the power amplifier. There is a linear correspondence between an amplitude of the first signal and the real-time operating voltage of the power amplifier 1. When the amplitude of the first signal increases, the real-time operating voltage of the power amplifier 1 increases; and when the amplitude of the first signal decreases, the real-time operating voltage of the power amplifier 1 decreases. In this way, the power amplifier 1 may operate in a saturation region most of the time. It can be learned that the apparatus shown in FIG. 2 can improve average efficiency of the power amplifier.

In this embodiment of this application, a structure similar to that of the second transmit channel shown in FIG. 1 or a structure similar to that of a first transmit channel shown in FIG. 2 may be used for a second transmit channel, used to amplify the second signal, in the apparatus shown in FIG. 2.

Figure 3:
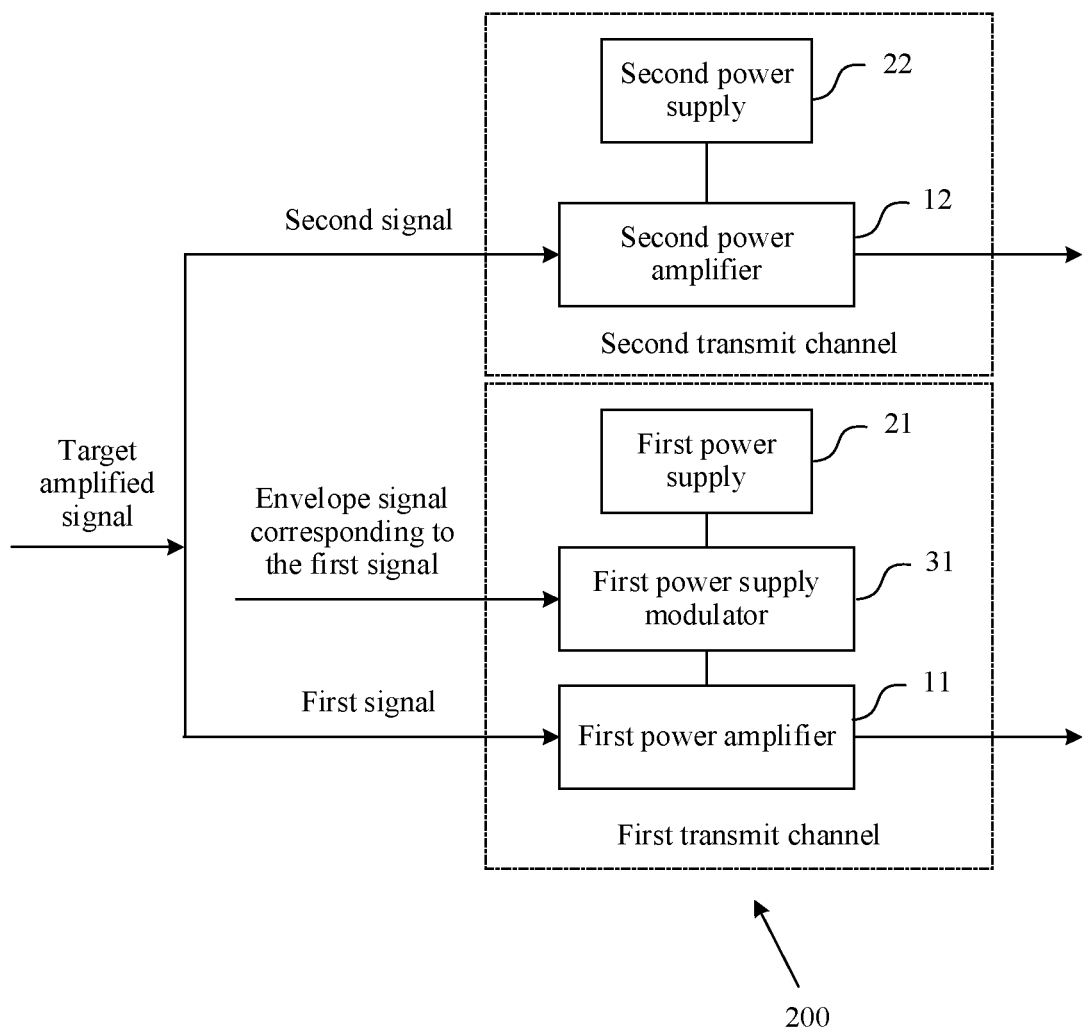
FIG. 3 is a third schematic structural diagram of a power amplification apparatus according to an embodiment of this application.

FIG. 3 is a third schematic structural diagram of a power amplification apparatus according to this application. When the structure similar to that of the second transmit channel shown in FIG. 1 is used for the second transmit channel in the apparatus 200 shown in FIG. 2, a structure of the apparatus 200 shown in FIG. 2 may be shown in FIG. 3. The apparatus 200 shown in FIG. 3 may include a first power amplifier 11, a first power supply 21, a first power supply modulator 31, a second power amplifier 12, and a second power supply 22. A connection manner and a work mechanism between the first power amplifier 11, the first power supply 21, and the first power supply modulator 31 are the same as a connection manner and a work mechanism between the power amplifier 1, the power supply 2, and the power supply modulator 3 in FIG. 2. Details are not described herein again. The second power amplifier 12 may operate at a fixed operating voltage provided by the second power supply 22.

Figure 4:
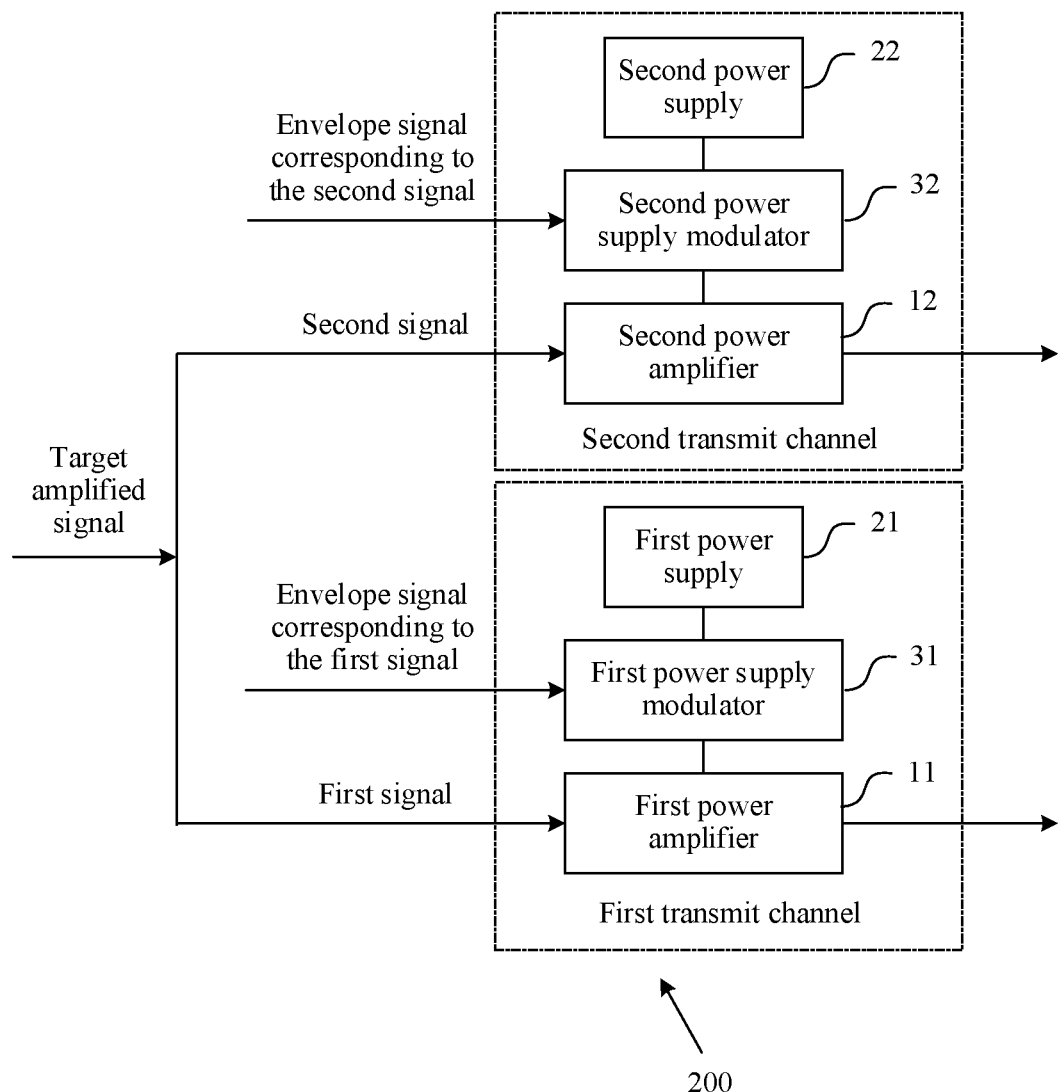
FIG. 4 is a fourth schematic structural diagram of a power amplification apparatus according to an embodiment of this application.

FIG. 4 is a fourth schematic structural diagram of a power amplification apparatus according to this application. When the structure similar to that of the first transmit channel shown in FIG. 2 is used for the second transmit channel in the apparatus 200 shown in FIG. 2, a structure of the apparatus 200 shown in FIG. 2 may be shown in FIG. 4.

The apparatus 200 shown in FIG. 4 may include a first power amplifier 11, a first power supply 21, a first power supply modulator 31, a second power amplifier 12, a second power supply 22, and a second power supply modulator 32. A connection manner and a work mechanism between the first power amplifier 11, the first power supply 21, and the first power supply modulator 31 are the same as a connection manner and a work mechanism between the power amplifier 1, the power supply 2, and the power supply modulator 3 in FIG. 2. A connection manner and a work mechanism between the second power amplifier 12, the second power supply 22, and the second power supply modulator 32 are the same as the connection manner and the work mechanism between the power amplifier 1, the power supply 2, and the power supply modulator 3 in FIG. 2. That is, the second power supply 22 is connected to the second power amplifier 12 through the second power supply modulator 32. The second power supply modulator 32 may be configured to control, based on an envelope signal corresponding to a second signal, an operating voltage provided by the second power supply 22 to the second power amplifier 12. A work mechanism in a control process of the second power supply modulator 32 is similar to that of the first power supply modulator 31.

A target amplified signal may be split into a first digital signal and a second digital signal based on a first amplitude range and a second amplitude range. The second signal may be a second analog signal obtained by performing digital-to-analog conversion on the second digital signal. The envelope signal corresponding to the second signal may be a second analog envelope signal obtained by performing digital-to-analog conversion on a second digital envelope signal corresponding to the second digital signal, or the envelope signal corresponding to the second signal may be an envelope signal corresponding to the second analog signal obtained by performing digital-to-analog conversion on the second digital signal. The envelope signal corresponding to the second signal may be used to reflect a time-varying amplitude of the second digital signal.

By using the apparatus 200 shown in FIG. 4, a real-time operating voltage of the second power amplifier 12 may change with the amplitude of a third part of the target amplified signal, where the amplitude of the third part falls within the second amplitude range. There is a linear correspondence between an amplitude of the second signal and the real-time operating voltage of the second power amplifier 12. In this way, the second power amplifier 12 operates in a saturation region most of the time. It can be learned that the power amplifiers in the apparatus system shown in FIG. 4 can operate in the saturation region most of the time, and efficiency improvement of the power amplifiers on transmit channels can further bring improvement of average efficiency of the entire system.

In this embodiment of this application, when the target amplified signal is a digital signal, a signal processor may be used to split the target amplified signal into the first digital signal and the second digital signal based on the first amplitude range and the second amplitude range. A digital-to-analog converter may be used to perform digital-to-analog conversion processing on the first digital signal, the second digital signal, the first digital envelope signal, and the second digital envelope signal. A radio-frequency chain module may be used to perform modulation processing on the first analog signal and the second analog signal. In other embodiments of this application, the signal processor, the digital-to-analog converter, and the radio-frequency chain module are described by using examples.

In this embodiment of this application, there may be one or more power amplifiers on each transmit channel.

For example, there may be one or more first power amplifiers 11. Each of the first power amplifiers 11 is configured to receive a first signal, and amplify the first signal. The first power supply modulator 31 is connected to each of the first power amplifiers 11. For another example, there may be one or more second power amplifiers 12. Each of the second power amplifiers 12 is configured to receive the second signal, and amplify the second signal. The second power supply modulator 32 is connected to each of the second power amplifiers 12. When there are a plurality of power amplifiers on a transmit channel, the plurality of power amplifiers may receive, at a plurality of ports of a power splitter, a to-be-amplified signal on the transmit channel. In another embodiment of this application, a manner of a connection manner between power amplifiers and a manner of a connection between the power supply modulators and power amplifiers are described by using examples.

In an embodiment of this application, the apparatus 200 may further include an antenna. The antenna in the power amplification apparatus may be an antenna array including a plurality of antenna units. Each power amplifier in the power amplification apparatus may be connected to one antenna unit in the antenna array. Each antenna unit transmits, to the air, an amplified signal received from a correspondingly connected power amplifier. Finally, signals transmitted by the antenna units are superimposed in the air, to implement beamforming.

In an embodiment of this application, the apparatus 200 may further include a phase shifter. It should be noted that beamforming may be implemented by processing the signal transmitted by each antenna unit using at least one preprocessing technology of digital precoding or analog precoding. For the analog precoding processing manner, a phase shifter may be disposed in front of a power amplifier connected to each antenna element. Each phase shifter may perform phase shift processing on a signal before the signal enters the power amplifier correspondingly connected to the phase shifter. In another embodiment of this application, a manner of a connection between the phase shifter and the power amplifier is described by using an example. In addition, in another embodiment of this application, a beamforming system related to implementing beamforming in the digital precoding processing manner is further described by using an example.

Figure 5:
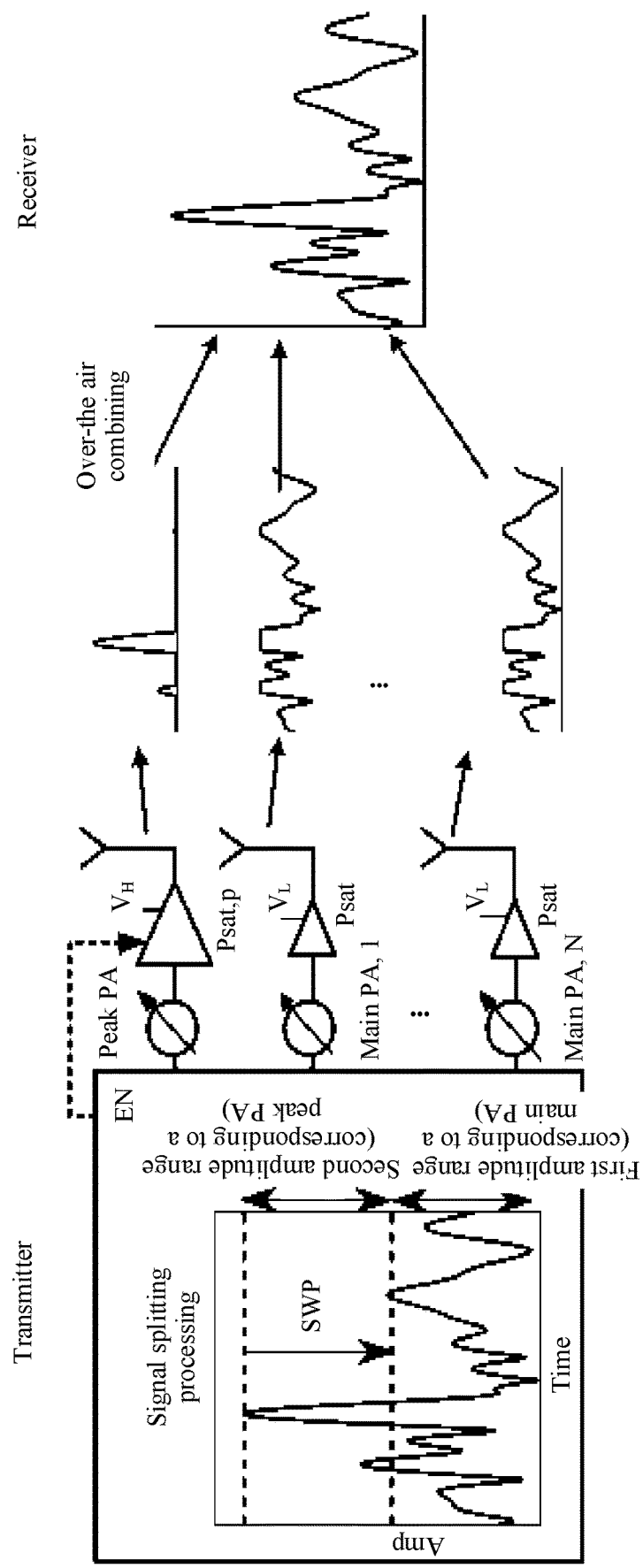
FIG. 5 is a schematic diagram of division of an amplitude of a target amplified signal according to an embodiment of this application.

In an embodiment of this application, an amplitude range of the target amplified signal may be divided into the first amplitude range and the second amplitude range based on amplitudes in an ascending order, that is, an amplitude value within the first amplitude range may be less than an amplitude value within the second amplitude range. Alternatively, the amplitude range of the target amplified signal may be divided into the first amplitude range and the second amplitude range based on amplitudes in a descending order, that is, an amplitude value within the first amplitude range may be greater than an amplitude value within the second amplitude range. For example, a maximum value within the first amplitude range may be less than or equal to a minimum value within the second amplitude range. For another example, a maximum value within the second amplitude range may be less than or equal to a minimum value within the first amplitude range. FIG. 5 is a schematic diagram of division of an amplitude of the target amplified signal according to this embodiment of this application. FIG. 5 shows a case in which an amplitude value within the first amplitude range is less than an amplitude value within the second amplitude range.

It should be noted that, when the maximum value within the first amplitude range is less than or equal to the minimum value within the second amplitude range, the first transmit channel on which the first signal corresponding to the first amplitude range is amplified may be referred to as a main transmit channel, and the second transmit channel on which the second signal corresponding to the second amplitude range is amplified may be referred to as an auxiliary transmit channel (as shown in FIG. 5). When the maximum value within the second amplitude range is less than or equal to the minimum value within the second amplitude range, the first transmit channel may be referred to as a main transmit channel, and the second transmit channel may be referred to as an auxiliary transmit channel (not shown in the figure).

A power amplifier on the main transmit channel may be referred to as a main power amplifier, or may be referred to as a main PA (MPA) or a main element. The power amplifier on the auxiliary transmit channel may be referred to as an auxiliary power amplifier or a peak power amplifier, and may be referred to as an auxiliary PA, a peak PA (PPA), an auxiliary element, or a peak element (peaking element) for short. There may be a plurality of main PAs. A fixed voltage provided by a power supply connected to the main PA may be denoted as $V_L$, and a fixed voltage provided by a power supply connected to the peak power amplifier may be denoted as $V_H$. $V_H$ is a voltage that supports the auxiliary PA to amplify an amplitude of a signal to a reach the maximum value within the second amplitude range, and $V_L$ is a voltage that supports the main PA to amplify an amplitude of the signal to reach the maximum value within the first amplitude range, where $V_H > V_L$.

In an implementation of this application, it is assumed that the amplitude of the target amplified signal changes with time, and some transmit channels on the power amplification apparatus provided in an embodiment of this application may be set to enter an operating state only in some periods of time. FIG. 5 is used as an example. In some periods of time, the amplitude of the target amplified signal falls within the first amplitude range. In this case, the second power amplifier configured to amplify the second signal does not need to perform amplification processing. To reduce power consumption of the beamforming system, a control signal (Enable, EN) may be generated in the period of time when an amplitude of the target amplified signal falls within the second amplitude range, where the control signal is used to indicate the second power supply modulator and the second power supply to enter an operating state in the period of time when the amplitude of the target amplified signal falls within the second amplitude range. In other words, when the amplitude of the target amplified signal falls within the first amplitude range, at least one of the second power supply modulator and the second power supply stops operating, and further, the second power amplifier stops operating. In another embodiment of this application, a signal processor is used to generate the control signal, and a manner of a connection between the signal processor, a corresponding power supply modulator, and a power supply is described below using examples.

It should be further noted that, the manner of amplifying a signal based on division of amplitude ranges can improve average efficiency of a power amplifier while ensuring linearity of an amplified signal. When a conventional class A or class AB power amplifier is used to amplify the target amplified signal, if a rated voltage of the power amplifier is lowered to improve efficiency of the power amplifier, for example, a voltage corresponding to an average amplitude (Amp) of the target amplified signal is used to output power to the power amplifier, the power amplifier can amplify only a signal whose amplitude is less than the average amplitude, and a signal whose amplitude falls beyond the average amplitude is saturated and compressed. Consequently, serious distortion occurs on the amplified signal. However, the manner of amplifying a signal based on division of amplitude ranges (the manner of division shown in FIG. 5 is used as an example), a signal whose amplitude is greater than the average amplitude (which may be considered as the second amplitude range) is amplified by the peak power amplifier, and a signal whose amplitude is less than or equal to the average amplitude (which may be considered as the first amplitude range) is amplified by the main power amplifier. That is, the peak power amplifier and the main power amplifier respectively amplify the first signal and the second signal that are obtained by performing signal splitting processing based on the second amplitude range and the first amplitude range. Then, signals amplified by the main power amplifier and the peak power amplifier may be sent from a transmitter through an antenna array for over-the-air combining (over-the-air combining). In a complete signal obtained after the signals transmitted by antennas are spatially superimposed, the complete signal with a relatively high amplitude is not distorted. In other words, a receiver on a signal receiving side can receive a complete signal of high linearity. On this basis, because the amplitude value within the first amplitude range is less than the amplitude value within the second amplitude range overall, an operating voltage $V_L$ that the power supply of the main power amplifier needs to provide is relatively small. In addition, when no part of the target amplified signal falls within the second amplitude range in some periods of time, the peak power amplifier may suspend operating in some periods of time. In addition, the first power supply modulator and the second power supply modulator may be used to control, based on an envelope signal corresponding to the first signal and an envelope signal corresponding to the second signal, an actual power amplifier voltage output to the main power amplifier and an actual power amplifier voltage output to the peak power amplifier, respectively, to control an output power of the main power amplifier and an output power of the peak power amplifier to vary with respective envelope signals. In other words, both the main power amplifier and the peak power amplifier can operate, most of the time, in a power saturation region or a relatively low power back-off region when they are in an operating state. In conclusion, the power amplification apparatus provided in this embodiment of this application can improve average efficiency of the power amplification apparatus while maintaining relatively high linearity. In addition, a beamforming transmitter system that is improved based on a sequential power amplifier (SPA) technology may be obtained by applying the power amplification apparatus provided in this application to the beamforming system, and an envelope tracking technology is used to control an operating voltage of a power amplifier in the SPA technology, that is, the envelope tracking technology is applied to the SPA technology. Compared with a conventional class AB power amplifier, this can significantly improve linearity and synthesis efficiency.

The following describes an example of a structure of the power amplification apparatus in this embodiment of this application.

The following provides detailed description by using an example in which the first transmit channel corresponding to the first amplitude range is a main transmit channel.

Figure 6:
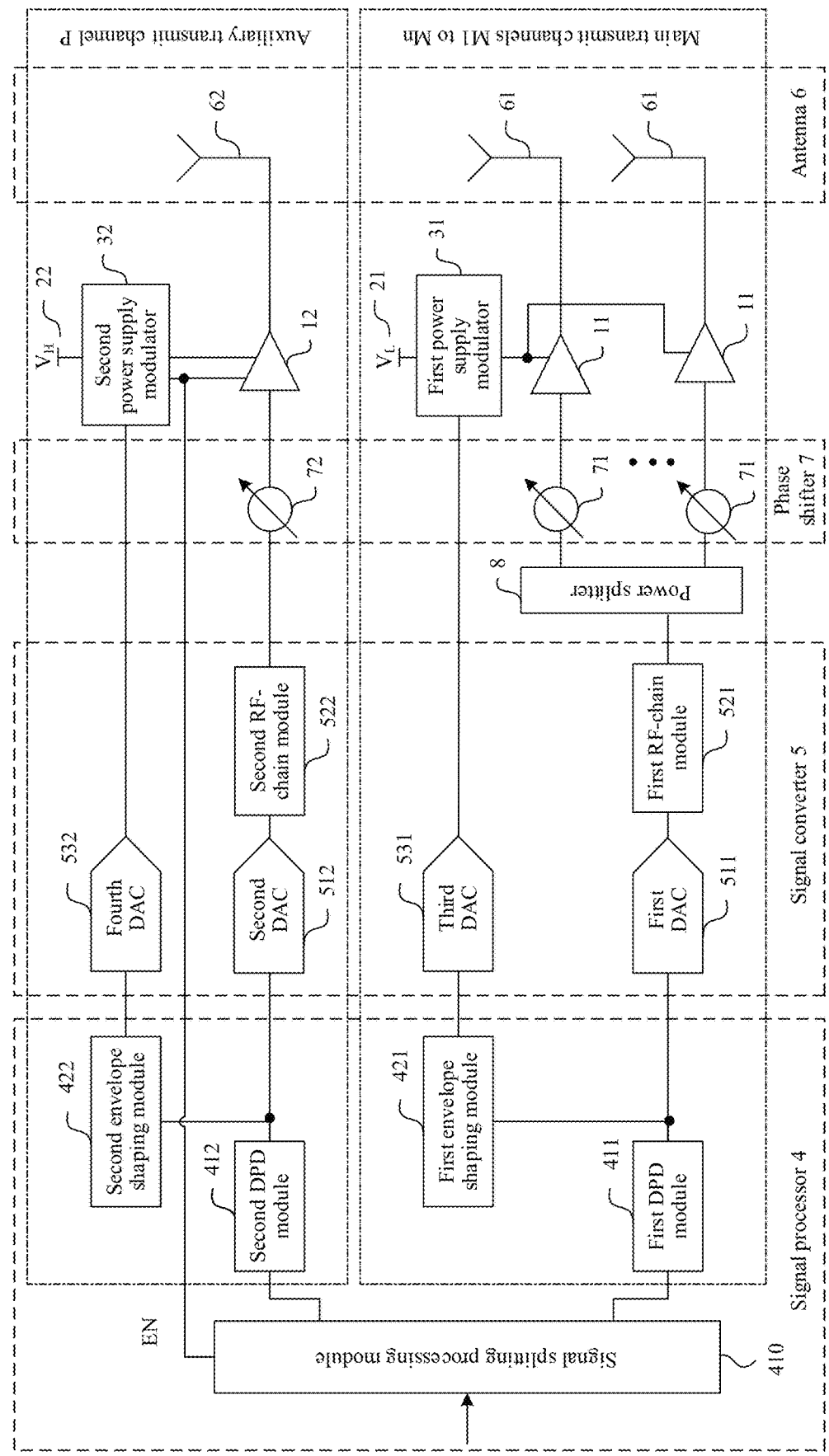
FIG. 6 is a fifth schematic structural diagram of a power amplification apparatus according to an embodiment of this application.

FIG. 6 is a fifth schematic structural diagram of a power amplification apparatus according to an embodiment of this application.

As shown in FIG. 6, in addition to the first power amplifier 11, the second power amplifier 12, the first power supply 21, the second power supply 22, the first power supply modulator 31, and the second power supply modulator 32 that are described above, the power amplification apparatus may further include a signal processor 4, a signal converter 5, an antenna 6, a phase shifter 7, and a power splitter 8. A rated output voltage of the first power supply 21 may be denoted as $V_H$, and a rated output voltage of the second power supply 22 may be denoted as $V_L$. It should be noted that the phase shifter 7 is not a mandatory component in the apparatus in this embodiment of this application.

In this embodiment of this application, a signal source is configured to input a to-be-amplified target amplified signal to the signal processor 4 (The signal source is intended to generate and provide the target amplified signal).

In this embodiment of this application, the signal processor 4 may include a signal splitting processing module 410, a first predistortion (DPD) module 411, a second DPD module 412, a first envelope shaping module 421, and a second envelope shaping module 422. An input end of the first DPD module 411 and an input end of the second DPD module 412 are connected to different output ends of the signal splitting processing module 410. An output end of the first DPD module 411 is connected to an input end of the first envelope shaping module 421, and an output end of the second DPD module 412 is connected to an input end of the second envelope shaping module 422.

For example, the signal splitting processing module 410 may be configured to receive the target amplified signal (for example, a to-be-amplified signal stream), and output a first digital signal and a second digital signal. The first digital signal is a first part of the target amplified signal, where the first part's amplitude falls within the first amplitude range. The second digital signal is a second part of the target amplified signal, where the second part's amplitude falls within the second amplitude range. The first DPD module 411 and the second DPD module 412 are respectively configured to perform predistortion processing on the received first digital signal and the received second digital signal, to improve signal linearity. The first envelope shaping module 421 is configured to generate a first digital envelope signal based on the first digital signal, and the second envelope shaping module 422 is configured to generate a second digital envelope signal based on the second digital signal.

In this embodiment of this application, the signal converter 5 may include a first digital-to-analog converter (DAC) 511, a second DAC 512, a first radio-frequency chain (RF-Chain) module 521, and a second RF-chain module 522. An input end of the first DAC 511 is connected to the output end of the first DPD module 411. An output end of the first DAC 511 is connected to an input end of the first RF-chain module 521. An input end of the second DAC 512 is connected to the output end of the second DPD module 412. An output end of the second DAC 512 is connected to an input end of the second RF-chain module 522.

The first DAC 511 and the second DAC 512 are respectively configured to perform digital-to-analog conversion on the first digital signal received from the first DPD module 411 and the second digital signal received from the second DPD module 412, to obtain a first converted signal and a second converted signal. The first RF-chain module 521 and the second RF-chain module 522 are respectively configured to perform processing such as modulation, filtering, and pre-amplification on the first converted signal received from the first DAC 511 and the second converted signal received from the second DAC 512, to obtain a first signal and a second signal. The two signals are generally radio-frequency signals.

In an embodiment of this application, the signal converter 5 may further include a third DAC 531 and a fourth DAC 532. An input end of the third DAC 531 may be connected to an output end of the first envelope shaping module 421. An output end of the third DAC 531 may be connected to the first power supply modulator 31. An input end of the fourth DAC 532 may be connected to an output end of the second envelope shaping module 422. An output end of the fourth DAC 532 may be connected to the second power supply modulator 32.

The third DAC 531 may be configured to perform digital-to-analog conversion on the first digital envelope signal received from the first envelope shaping module 421, to obtain a first analog envelope signal, and send the first analog envelope signal to the first power supply modulator 31. The fourth DAC 532 may be configured to perform digital-to-analog conversion on the second digital envelope signal received from the second envelope shaping module 422, to obtain a second analog envelope signal and send the second analog envelope signal to the second power supply modulator 32.

In an embodiment of this application, when an amplitude of the target amplified signal falls within a first amplitude range, the second power amplifier 12 on an auxiliary transmit channel may suspend operating. For example, the signal processor 4 (for example, the signal splitting processing module 410 shown in FIG. 6) generates a control signal, and sends the control signal to the second power amplifier 12 and/or the second power supply modulator 32. The signal splitting processing module 410 may be disposed to connect to the second power amplifier 12 and the second power supply modulator 32 in the power amplification apparatus. In another embodiment of this application, the control signal may alternatively be generated by another module (not shown in the figure) in the signal processor 4.

For example, when detecting that the amplitude of the target amplified signal falls within the first amplitude range (that is, falls beyond the second amplitude range) in some periods of time, the signal processor 4 may be configured to generate a control signal (Enable, EN) that is used to indicate to the second power amplifier 12 and/or the second power supply modulator 32 to suspend operating, and send the control signal to the second power amplifier 12 and the second power supply modulator 32. For another example, when the amplitude of the target amplified signal falls within the second amplitude range, the signal processor 4 may generate a control signal (EN) that is used to indicate to the second power amplifier 12 and/or the second power supply modulator 32 to enter an operating state, and send the control signal to the second power amplifier 12 and the second power supply modulator 32. The second power supply modulator 32 and the second power amplifier 12 may enter the operating state only when receiving the control signal.

In an embodiment of this application, a main transmit channel may include X main power amplifiers, that is, X first power amplifiers 11, where X is greater than or equal to 1. When X is greater than 1, each of the first power amplifiers 11 in the power amplification apparatus may be connected to one of X output ends of the power splitter 8, to receive the first signal corresponding to the first amplitude range. An input end of the power splitter 8 may be connected to an output end of the first RF-chain module 521. When X is equal to 1, the first power amplifier 11 may be connected to the first RF-chain module 521.

In an embodiment of this application, the antenna 6 in the power amplification apparatus may include at least two antenna units, and the first power amplifier and the second power amplifier are separately connected to at least one antenna unit in the antenna. For example, the antenna 6 may include X first antenna units 61 and a second antenna unit 62. Input ends of the X first antenna units 61 are one-to-one connected to output ends of the X first power amplifiers 11. An input end of the second antenna unit 62 is connected to an output end of the second power amplifier 12. For example, the antenna 6 may be an antenna array including several antenna units, and the first power amplifiers and the second power amplifier each may be connected to one antenna unit in the antenna array.

In an embodiment of this application, the phase shifter 7 in the power amplification apparatus may include X first phase shifters 71 and a second phase shifter 72. The X first power amplifiers 11 are one-to-one correspond to the X first phase shifters 71. An input end of each first power amplifier 11 is connected to an output end of the power splitter 8 through a first phase shifter 71. The second phase shifter 72 may be connected to an output end of the second RF-chain module.

In an embodiment of this application, when a quantity of first power amplifiers 11 on the main transmit channel is greater than 1, there may be one or more first power supply modulators 31 and one or more first power supplies 21.

For example, as shown in FIG. 6, there is one first power supply 21 and one first power supply modulator 31. The first power supply modulator 31 may be connected to the X first power amplifiers, and the first power supply modulator 31 may control, based on the first analog envelope signal received from the third DAC, an operating voltage output to each first power amplifier 11.

For another example, in consideration of a capability of a single power supply modulator to drive a power amplifier, there may be a plurality of first power supplies 21 and a plurality of first power supply modulators 31. For example, a quantity of first power supplies 21 and a quantity of first power supply modulators may be the same as a quantity of first power amplifiers 11. The quantity of the first power amplifier 11, the quantity of the first power supply 21, and the quantity of the first power supply modulator 31 each may be X.

Figure 7:
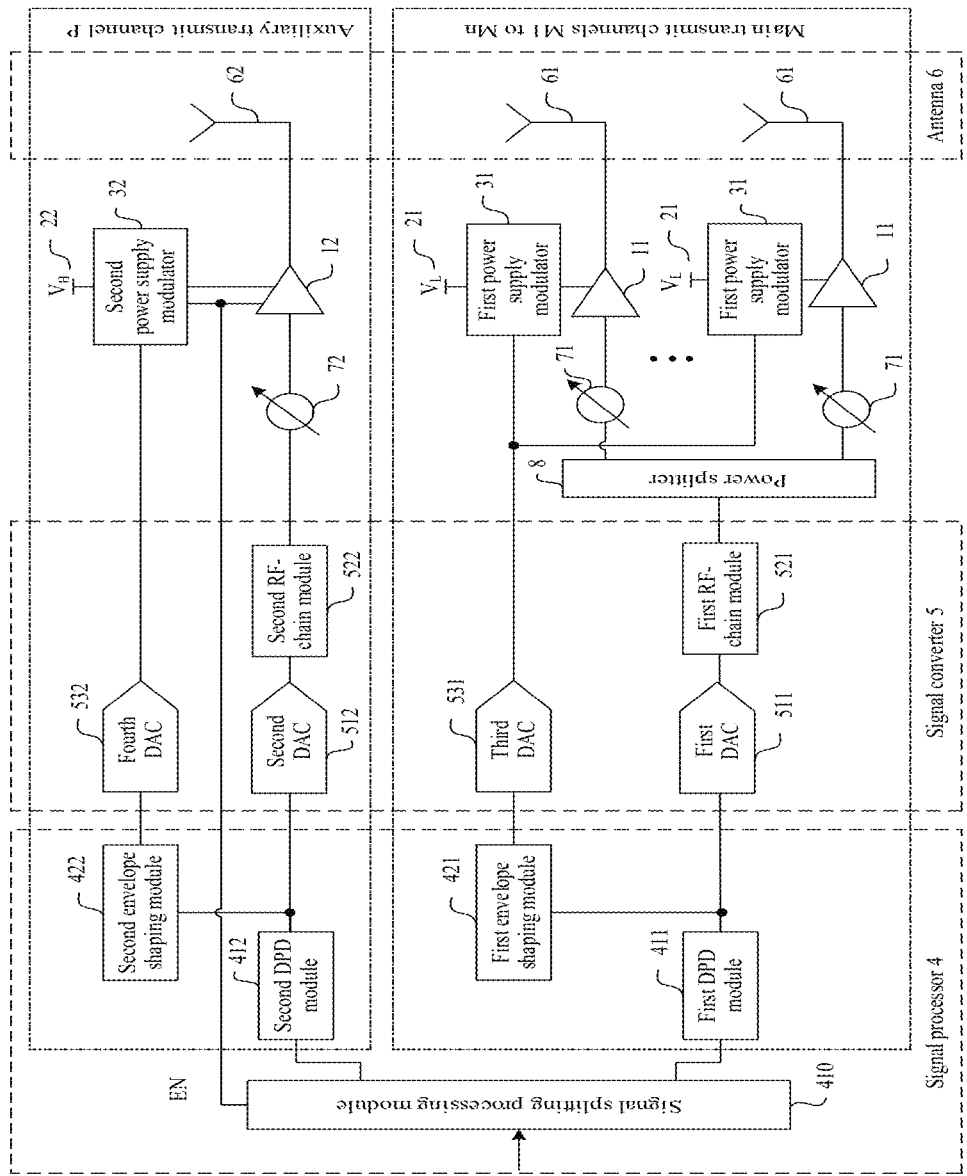
FIG. 7 is a sixth schematic structural diagram of a power amplification apparatus according to an embodiment of this application.

FIG. 7 is a sixth schematic structural diagram of a power amplification apparatus according to an embodiment of this application. As shown in FIG. 7, X first power supplies 21 are one-to-one connected to X first power supply modulators 31. The X first power supply modulators 31 are one-to-one connected to the X first power amplifiers 11. The $i^{th}$ first power supply modulator 31 in the X first power supply modulators 31 may be configured to receive an envelope signal corresponding to a first signal, and control, based on the envelope signal corresponding to the first signal, an operating voltage provided by the $i^{th}$ first power supply 21 in the X first power supplies 21 to the $i^{th}$ first power amplifier 11.

In an embodiment of this application, an amplitude range of a target amplified signal may be divided into a first amplitude range, a second amplitude range, and a third amplitude range. For example, a minimum value within the third amplitude range may be greater than or equal to a maximum value within the second amplitude range. A minimum value within the second amplitude range may be greater than or equal to a maximum value within the first amplitude range. Based on any one of the apparatuses shown in FIG. 2 to FIG. 4, and FIG. 6, this embodiment of this application further provides the power amplification apparatus. The power amplification apparatus may be configured to amplify the first signal, a second signal, and a third signal that are obtained by performing splitting processing based on the first amplitude range, the second amplitude range, and the third amplitude range.

Figure 8:
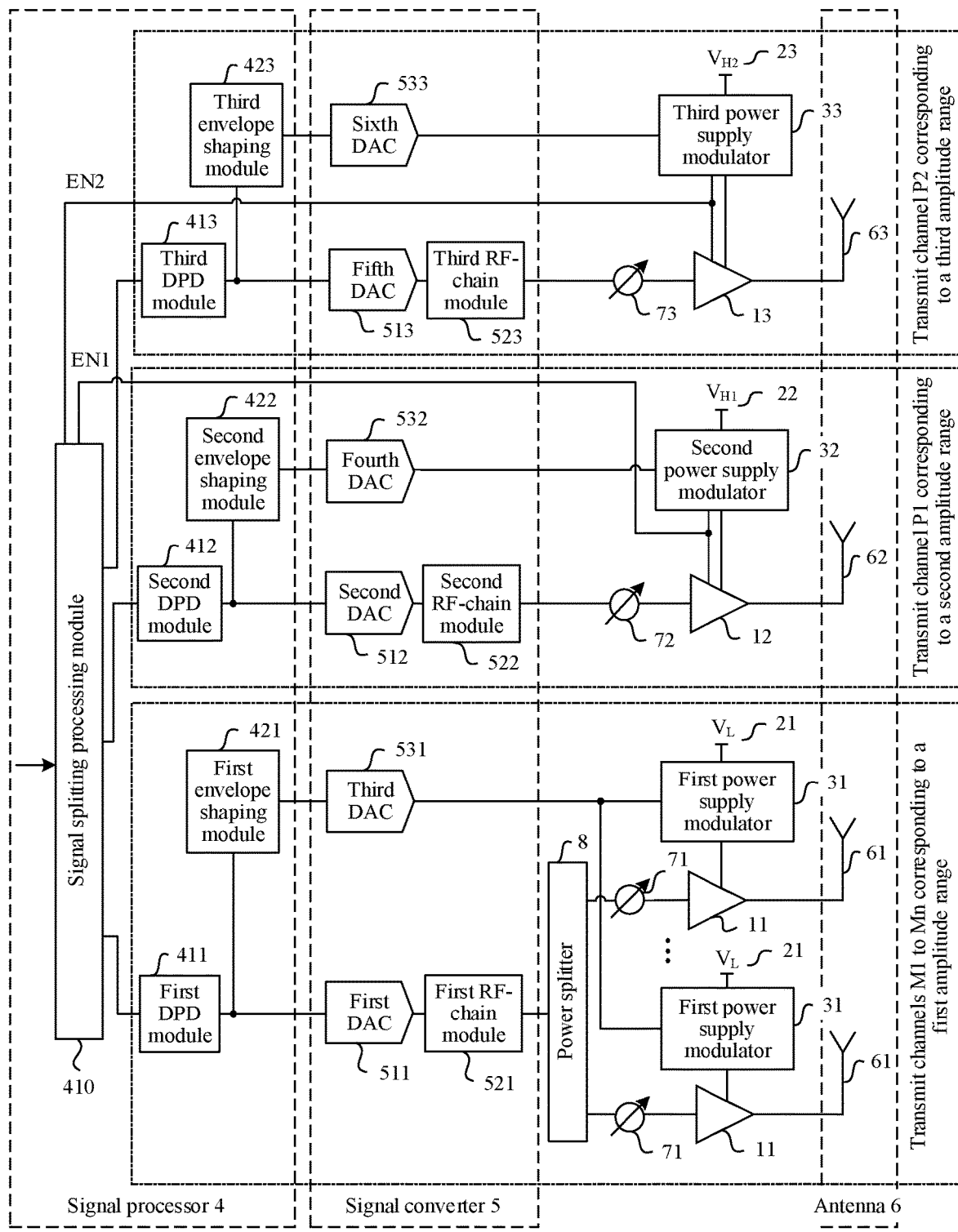
FIG. 8 is a seventh schematic structural diagram of a power amplification apparatus according to an embodiment of this application.

FIG. 8 is a seventh schematic structural diagram of a power amplification apparatus according to an embodiment of this application. As shown in FIG. 8, the power amplification apparatus provided in this embodiment of this application may further include a third power amplifier 13, a third power supply 23, and a third power supply modulator 33. The third power amplifier 13 is configured to amplify the third signal. The third power supply modulator 33 may be configured to control, based on an envelope signal corresponding to a third signal, an operating voltage provided by the third power supply 23 to the third power amplifier 13.

It should be noted that the third signal may be generated based on a fourth part of the target amplified signal, where the amplitude of the fourth part falls within a third amplitude range. A manner of generating the third signal is similar to that of the second signal, except that corresponding amplitude ranges are different. For example, the third signal may be a third digital signal obtained by performing splitting processing on the target amplified signal based on the third amplitude range, or a corresponding analog signal or a radio-frequency signal obtained by converting the third digital signal. The envelope signal corresponding to the third signal may be an envelope signal corresponding to the third digital signal obtained by performing splitting processing on the target amplified signal based on the third amplitude range.

For example, when the target amplified signal is a digital signal, a signal processor 4 in the power amplification apparatus may further include a third DPD module 413 and a third envelope shaping module 423. A signal converter 5 may further include a fifth DAC, a third RF-Chain module, and a sixth DAC. A manner of a connection between the third DPD module 413, the third envelope shaping module 423, the fifth DAC 513, the third RF-chain module 523, the sixth DAC 533, the third power amplifier 13, the third power supply 23, and the third power supply modulator 33 is the same as a manner of a connection between the second DPD module 412, the second envelope shaping module 422, the second DAC 512, the second RF-chain module 522, the fourth DAC 532, the second power amplifier 12, the second power supply 22, and the second power supply modulator 32.

In addition, the third power supply modulator 33 and the third power supply 23 may enter an operating state when an amplitude of the target amplified signal falls within the third amplitude range. For example, the signal splitting processing module 410 in the signal processor 4 may send, to the third power supply modulator 33 and the third power supply 23, a control signal (for example, EN2 in FIG. 8) that is used to indicate the third power supply modulator 33 and the third power supply 23 to enter the operating state when the amplitude of the target amplified signal falls within the third amplitude range.

An embodiment of this application further provides a beamforming system. The beamforming system may include at least one power amplification apparatus shown in FIG. 1 and at least one power amplification apparatus shown in FIG. 2 to FIG. 8. Alternatively, the beamforming system may include at least two power amplification apparatuses shown in any one of FIG. 2 to FIG. 8. When at least one of the at least two power amplification apparatuses in the beamforming system controls, based on a tracked envelope signal by setting a power supply modulator, an operating voltage provided to a power amplifier, so that average efficiency of the beamforming system can be improved. The following provides detailed description by using an example in which a beamforming system includes at least two power amplification apparatuses shown in any one of FIG. 2 to FIG. 8.

Figure 9A:
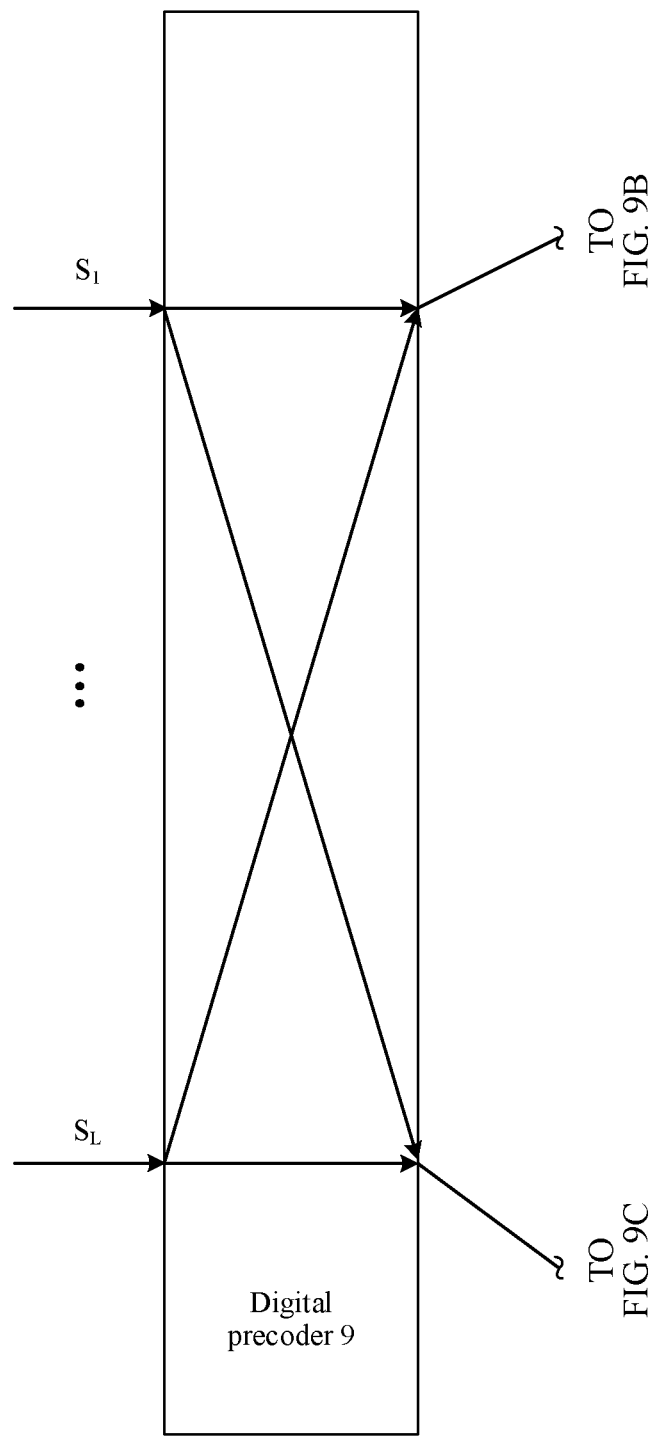
FIG. 9A to FIG. 9C are a first schematic structural diagram of a beamforming system according to an embodiment of this application.
Figure 9B:
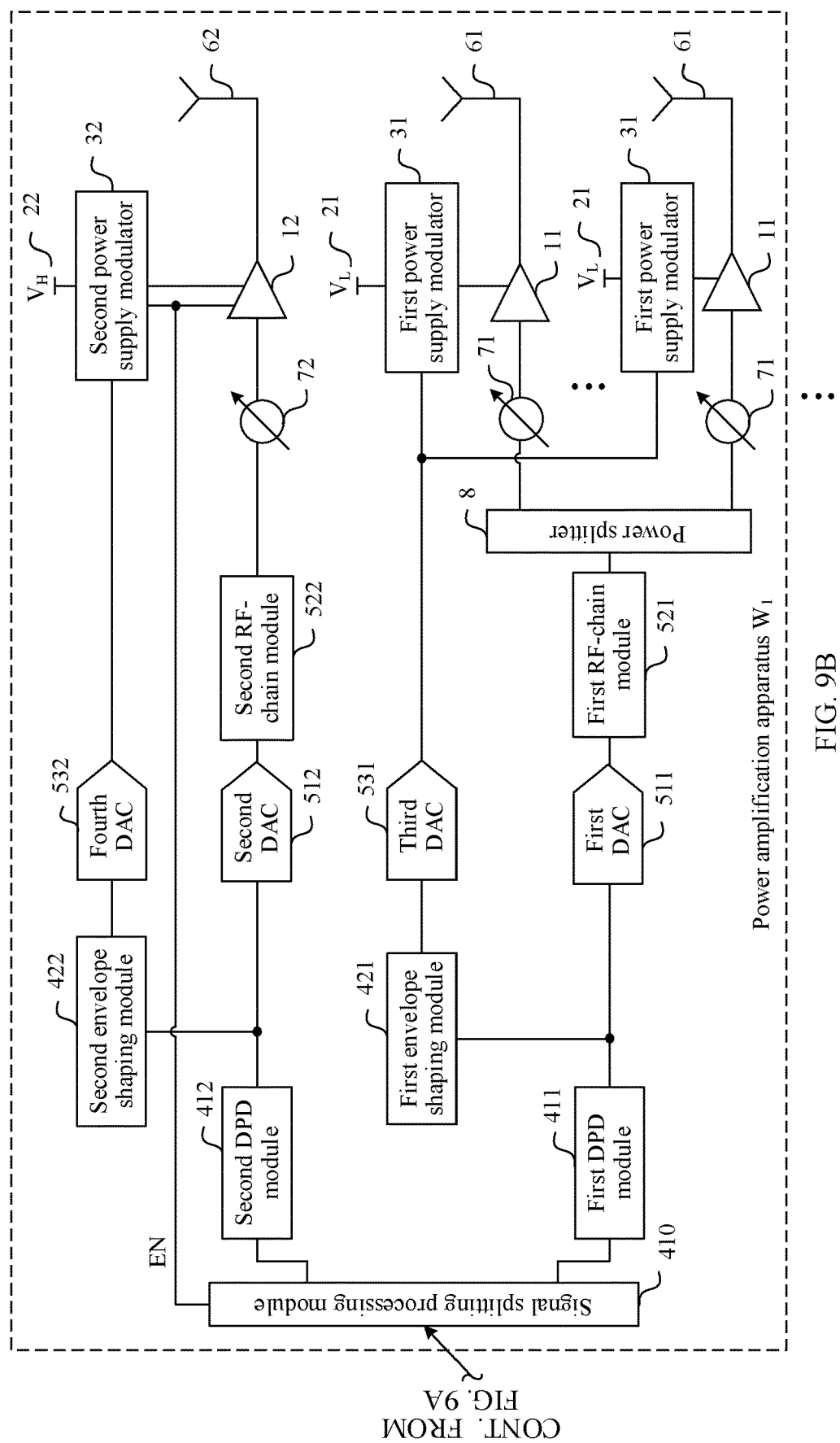
Figure 9C:
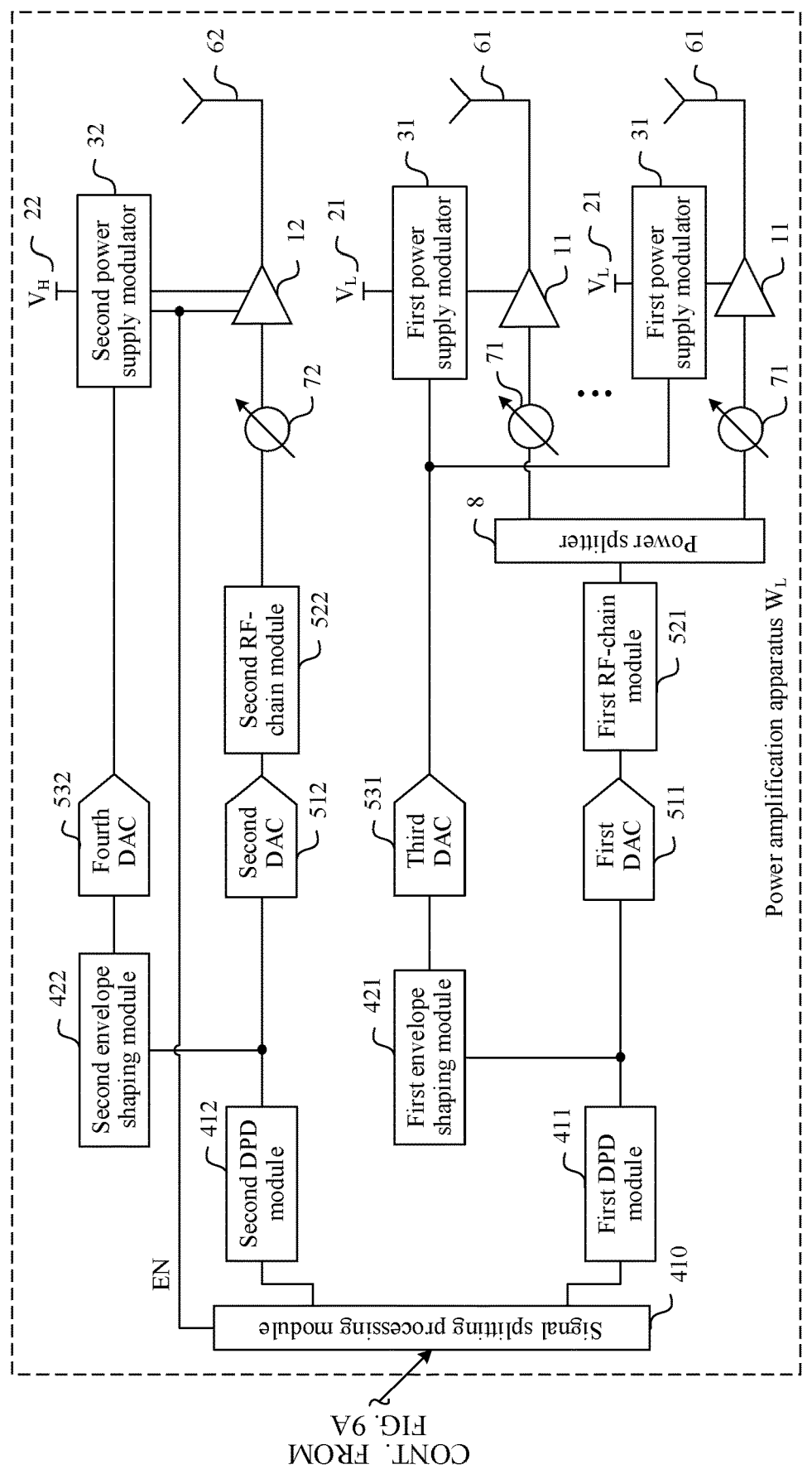

FIG. 9A to FIG. 9C are a first schematic structural diagram of a beamforming system according to an embodiment of this application.

As shown in FIG. 9A to FIG. 9C, the beamforming system in this embodiment of this application may include a digital precoder 9 and at least two power amplification apparatuses. The digital precoder 9 may be configured to receive at least two signal streams. The digital precoder 9 may perform digital precoding processing on the at least two signal streams, to obtain at least two to-be-amplified target amplified signals. Input ends of the at least two power amplification apparatuses each are connected to one of a plurality of output ends of the digital precoder 9. For example, the at least two signal streams may be denoted as $S_1$ to $S_L$, where L is greater than 1. The at least two power amplification apparatuses may be denoted as $W_1$ to $W_L$. Each power amplification apparatus may be configured to amplify a received target amplified signal.

It should be noted that, to implement beamforming, the digital precoder 9 in the beamforming system shown in FIG. 9A to FIG. 9C may be configured to implement signal precoding processing in a digital domain. Each phase shifter in each power amplification apparatus in FIG. 9A to FIG. 9C may be configured to implement signal precoding processing in an analog domain. The power amplification apparatus including a phase shifter may be referred to as a subarray or a subarray structure. The beamforming system shown in FIG. 9A to FIG. 9C may include a plurality of subarrays, and may be used in a hybrid beamforming system that implements beamforming precoding processing on a plurality of streams of signals in both the digital domain and the analog domain. That is, this embodiment of this application provides a hybrid beamforming system with relatively high average efficiency.

An embodiment of this application further provides a simplified beamforming system.

Figure 10A:
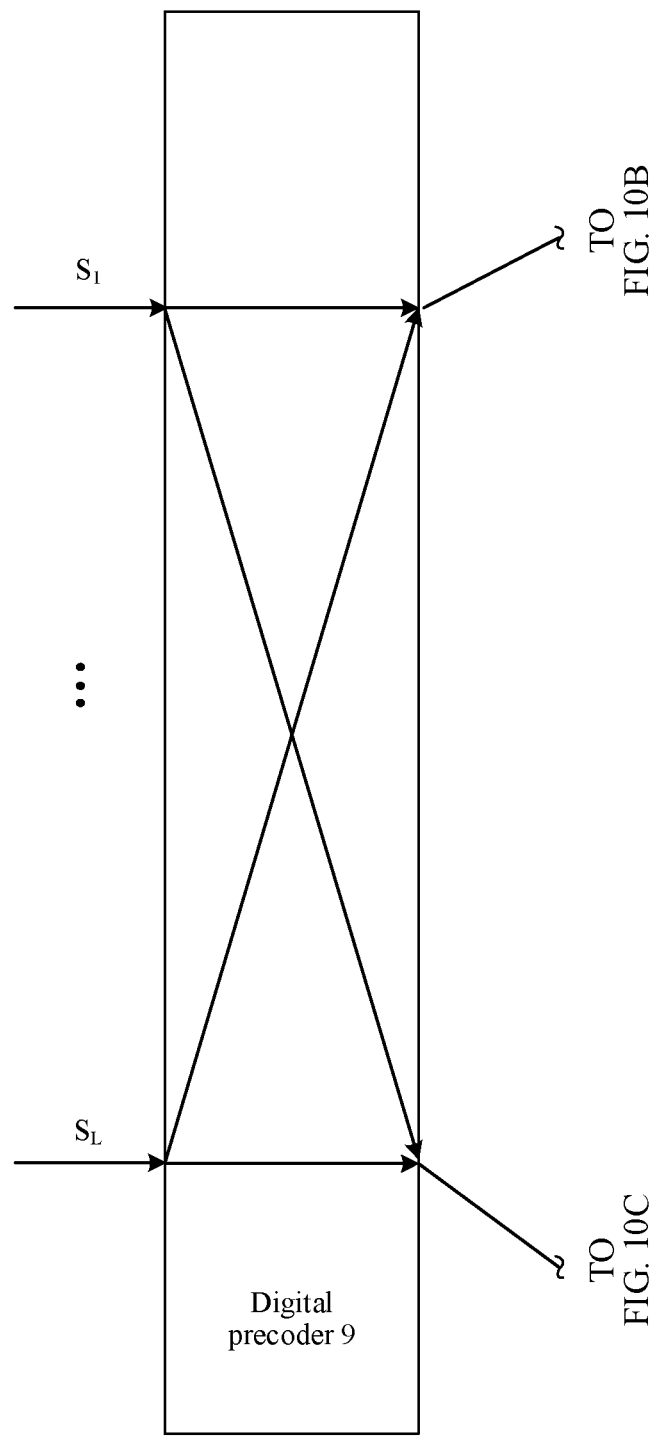
FIG. 10A to FIG. 10C are a second schematic structural diagram of a beamforming system according to an embodiment of this application.
Figure 10B:
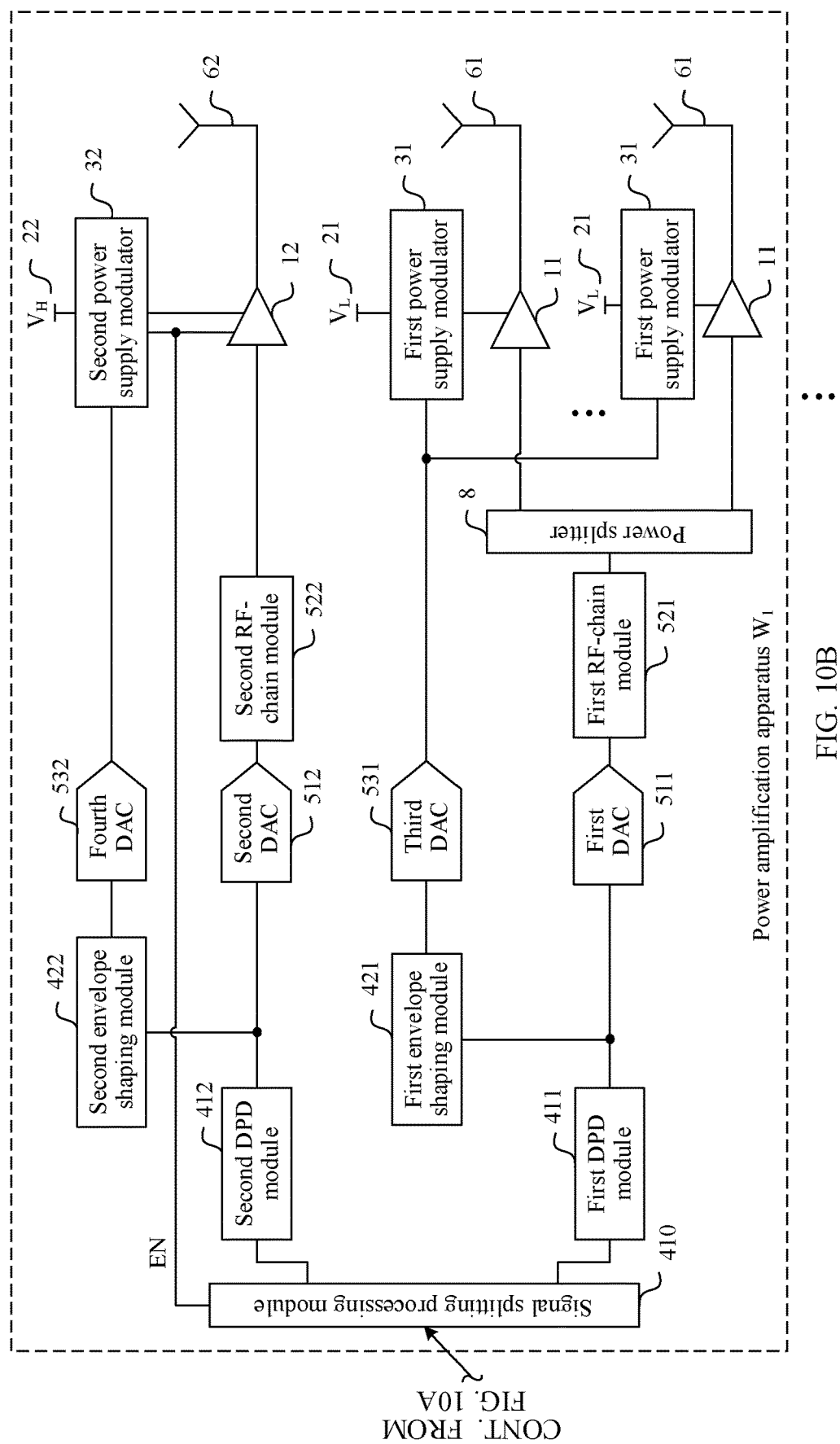
Figure 10C:
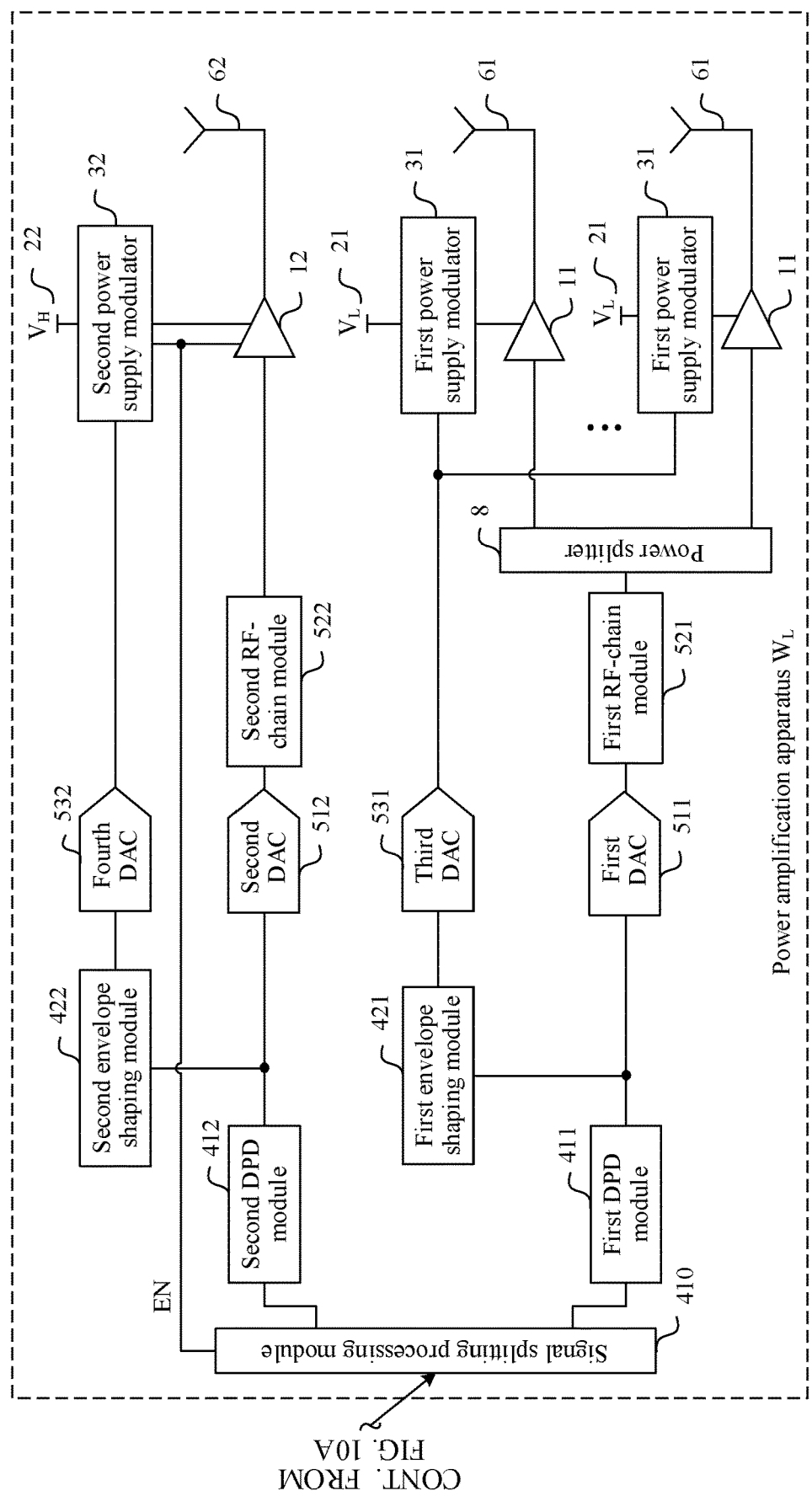

FIG. 10A to FIG. 10C are a second schematic structural diagram of a beamforming system according to an embodiment of this application. A difference between the beamforming system shown in FIG. 9A to FIG. 9C and the beamforming system shown in FIG. 10A to FIG. 10C lies in that no phase shifter is disposed in each power amplification apparatus in the beamforming system shown in FIG. 10A to FIG. 10C. Other components and connection manners in the beamforming system shown in FIG. 10A to FIG. 10C may be the same as those in the beamforming system shown in FIG. 9A to FIG. 9C. It should be noted that, the beamforming system shown in FIG. 10A to FIG. 10C may implement beamforming of the multi-stream signal only by performing precoding processing in a digital domain. That is, this embodiment of this application provides a digital beamforming system with relatively high average efficiency.

For other details and technical effects of the technical solution in this embodiment of this application, refer to descriptions in the embodiments in FIG. 2 to FIG. 8. Details are not described herein again.

An embodiment of this application further provides a transmitter. The transmitter may include the power amplification apparatus shown in FIG. 2 to FIG. 4 and FIG. 6 to FIG. 8, or the beamforming system shown in FIG. 8 or FIG. 9A to FIG. 9C.

An embodiment of this application further provides a base station. The base station may include a transmitter and a receiver. The transmitter may include the power amplification apparatus shown in any one of FIG. 2 to FIG. 4 and FIG. 6 to FIG. 8, or the beamforming system shown in FIG. 8 or FIG. 9A to FIG. 9C.

The embodiments of this application provide the beamforming system applicable to a subarray structure. The technical solutions provided in the embodiments of this application provide the envelope technology-based power amplification architecture solution. Beneficial effects include, but are not limited to, the following: Overall efficiency of the beamforming system is improved while linearity and an output power of the beamforming system are ensured, system reliability is improved, and further requirements of the system on a heat dissipation system are reduced. In addition, an over-the air combining method is used to improve linearity, thereby avoiding bandwidth limitation and a waste of power consumption that are caused due to combining performed at a circuit level. In this way, the system has broadband characteristics and is more suitable for a millimeter-wave communication system.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to this application are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive Solid State Disk), or the like.

What is claimed is:

1. A power amplification apparatus, comprising:
a power amplifier,
a power supply, and
a power supply modulator,
wherein the power supply is connected to the power amplifier through the power supply modulator;
the power amplifier is configured to amplify a first signal;
the power supply modulator is configured to control, based on an envelope signal corresponding to the first signal, an operating voltage provided by the power supply to the power amplifier; and
the power amplification apparatus is further configured to amplify a second signal, wherein the first signal is generated based on a first part of a target amplified signal, wherein the first part's amplitude falls within a preset amplitude range, and the second signal is generated based on a second part of the target amplified signal, wherein the second part's amplitude falls beyond the preset amplitude range.

2. The apparatus according to claim 1, wherein the power amplifier is a first power amplifier, the power supply is a first power supply, and the power supply modulator is a first power supply modulator;
the apparatus further comprises a second power amplifier and a second power supply, wherein
the second power amplifier is configured to amplify the second signal; and
the second power supply is configured to provide an operating voltage to the second power amplifier.

3. The apparatus according to claim 2, wherein the apparatus further comprises a second power supply modulator, wherein
the second power supply is connected to the second power amplifier through the second power supply modulator; and
the second power supply modulator is configured to control, based on an envelope signal corresponding to the second signal, an operating voltage provided by the second power supply to the second power amplifier.

4. The apparatus according to claim 3, wherein the power amplification apparatus further comprises a signal processor, wherein the signal processor is configured to receive the target amplified signal, and output a first digital signal and a second digital signal; the first digital signal is obtained based on the first part of the target amplified signal; the second digital signal is obtained based on the second part of the target amplified signal; and a first analog signal and a second analog signal are obtained by performing digital-to-analog conversion on the first digital signal and the second digital signal respectively; and
the signal processor is further configured to generate a first digital envelope signal based on the first digital signal, and generate a second digital envelope signal based on the second digital signal, wherein the envelope signal corresponding to the first signal is a first analog envelope signal obtained by performing digital-to-analog conversion on the first digital envelope signal, and the envelope signal corresponding to the second signal is a second analog envelope signal obtained by performing digital-to-analog conversion on the second digital envelope signal.

5. The apparatus according to claim 4, wherein the apparatus further comprises a signal converter, wherein
the signal converter comprises a first digital-to-analog converter, a second digital-to-analog converter, a first radio-frequency chain module, and a second radio-frequency chain module, wherein the first digital-to-analog converter is connected to the first radio-frequency chain module, and the second digital-to-analog converter is connected to the second radio-frequency chain module;
the first digital-to-analog converter and the second digital-to-analog converter are configured to perform digital-to-analog conversion on the first digital signal and the second digital signal respectively, to obtain a first converted signal and a second converted signal; and the first radio-frequency chain module and the second radio-frequency chain module are configured to modulate the first converted signal and the second converted signal respectively, to obtain the first analog signal and the second analog signal; and
the signal converter further comprises a first envelope conversion circuit and a second envelope conversion circuit, wherein
the first envelope conversion circuit is configured to perform digital-to-analog conversion on the first digital envelope signal to obtain the first analog envelope signal, and the second envelope conversion circuit is configured to perform digital-to-analog conversion on the second digital envelope signal to obtain the second analog envelope signal.

6. The apparatus according to claim 3, wherein the preset amplitude range is a first amplitude range, and the second signal is generated based on a third part of the target amplified signal, wherein an amplitude of the target amplified signal falls within a second amplitude range; and
a maximum value within the first amplitude range is less than or equal to a minimum value within the second amplitude range, or a maximum value within the second amplitude range is less than or equal to a minimum value within the first amplitude range.

7. The apparatus according to claim 6, wherein the maximum value within the first amplitude range is less than or equal to the minimum value within the second amplitude range; and
the second power amplifier and the second power supply modulator are further configured to enter an operating state when receiving a control signal, wherein the control signal is generated when an amplitude of the target amplified signal falls within the second amplitude range.

8. The apparatus according to claim 6, further comprising two or more first power amplifiers, wherein the maximum value within the first amplitude range is less than or equal to the minimum value within the second amplitude range;
a quantity of first power amplifiers is X, and X is greater than or equal to 1;
each of the X first power amplifiers is configured to receive the first signal and amplify the first signal; and
the first power supply is connected to each of the first power amplifiers through the first power supply modulator.

9. The apparatus according to claim 8, wherein a quantity of first power supplies is X, and a quantity of first power supply modulators is X; and
the X first power supplies are one-to-one connected to the X first power supply modulators, and the X first power supply modulators are one-to-one connected to the X first power amplifiers, wherein
an $i^{th}$ first power supply modulator in the X first power supply modulators is configured to receive the envelope signal corresponding to the first signal, and control, based on the envelope signal corresponding to the first signal, an operating voltage provided by an $i^{th}$ first power supply in the X first power supplies to an $i^{th}$ first power amplifier in the X first power amplifiers.

10. The apparatus according to claim 8, wherein the apparatus further comprises X first phase shifters and a second phase shifter;
each of the X first phase shifters is configured to receive the first signal, the X first phase shifters are one-to-one connected to the X first power amplifiers, and any one of the X first power amplifiers is configured to amplify the first signal received from a correspondingly connected first phase shifter; and
the second phase shifter is configured to receive the second signal, the second phase shifter is connected to the second power amplifier, and the second power amplifier is configured to amplify the second signal received from the second phase shifter.

11. The apparatus according to claim 7, wherein the apparatus further comprises an antenna, the antenna comprises at least two antenna units, and the first power amplifier and the second power amplifier are separately connected to at least one antenna unit in the antenna.

12. A beamforming system, wherein the system comprises a digital precoder and at least two power amplification apparatuses, and at least one of the at least two power amplification apparatuses is the power amplification apparatus according to claim 1;
the digital precoder is connected to input ends of the at least two power amplification apparatuses; and
the digital precoder is configured to receive at least one signal stream, and precode the at least one signal stream to obtain at least two target amplified signals; and the digital precoder is further configured to send the at least two target amplified signals to the at least two power amplification apparatuses, wherein the at least two target amplified signals correspond to the at least two power amplification apparatuses respectively.

13. A transmitter, comprising the power amplification apparatus according to claim 1.

14. A transmitter, comprising the beamforming system according to claim 12.

15. A base station, comprising the power amplification apparatus according to claim 1.

16. A base station, comprising the beamforming system according to claim 12.

* * * * *